United States Patent
Paz de Araujo et al.

(10) Patent No.: US 10,211,398 B2
(45) Date of Patent: Feb. 19, 2019

(54) METHOD FOR THE MANUFACTURE OF A CORRELATED ELECTRON MATERIAL DEVICE

(71) Applicant: ARM Ltd., Cambridge (GB)

(72) Inventors: Carlos Alberto Paz de Araujo, Colorado Springs, CO (US); Jolanta Bozena Celinska, Colorado Springs, CO (US); Lucian Shifren, San Jose, CA (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/641,143

(22) Filed: Jul. 3, 2017

(65) Prior Publication Data

US 2019/0006588 A1    Jan. 3, 2019

(51) Int. Cl.
*H01L 45/00*    (2006.01)
*H01L 49/00*    (2006.01)
*H01L 49/02*    (2006.01)

(52) U.S. Cl.
CPC ............ *H01L 49/003* (2013.01); *H01L 49/02* (2013.01)

(58) Field of Classification Search
CPC ... H01L 45/146; H01L 45/04; H01L 45/1641; H01L 45/1616; H01L 45/1608; H01L 49/02; H01L 49/003; H01L 49/1675
See application file for complete search history.

(56) References Cited

U.S. PATENT DOCUMENTS

| | | | |
|---|---|---|---|
| 7,298,640 B2 | 11/2007 | Chen et al. | |
| 7,639,523 B2 | 12/2009 | Celinska et al. | |
| 7,778,063 B2* | 8/2010 | Brubaker | H01L 27/2409 365/148 |
| 7,872,900 B2* | 1/2011 | Paz de Araujo | H01L 45/04 365/148 |
| 9,514,814 B1 | 12/2016 | Sandhu et al. | |
| 9,548,118 B1 | 1/2017 | Bhavnagarwala et al. | |
| 9,558,819 B1 | 1/2017 | Aitken et al. | |
| 95,489,636 | 3/2017 | Bhavnagarwala et al. | |
| 9,621,161 B1 | 4/2017 | Das et al. | |
| 9,627,615 B1 | 4/2017 | Reid et al. | |
| 9,660,189 B1 | 5/2017 | Reid et al. | |
| 9,734,895 B2 | 8/2017 | Savanth et al. | |
| 9,735,360 B2 | 8/2017 | Shifren et al. | |
| 9,735,766 B2 | 8/2017 | Shifren | |
| 9,747,982 B1 | 8/2017 | Shifren et al. | |

(Continued)

OTHER PUBLICATIONS

Invitation to Pay Additional Fees and, where applicable, Protest Fee, International Application No. PCT/GB2018/051822, dated Nov. 15, 2018, 5 pgs.

(Continued)

*Primary Examiner* — Nikolay Yushin
(74) *Attorney, Agent, or Firm* — Berkeley Law & Technology Group, LLP

(57) ABSTRACT

Disclosed is a method for the manufacture of a CEM device comprising forming a thin film of a correlated electron material having a predetermined electrical impedance when the CEM device in its relatively conductive (low impedance) state, wherein the forming of the CEM thin film comprises forming a d- or f-block metal or metal compound doped by a physical or chemical vapor deposition with a predetermined amount of a dopant comprising a back-donating ligand for the metal.

15 Claims, 5 Drawing Sheets

(56) References Cited

U.S. PATENT DOCUMENTS

| | | |
|---|---|---|
| 9,748,943 B2 | 8/2017 | Sandhu et al. |
| 9,755,146 B2 | 9/2017 | Shifren |
| 9,773,550 B2 | 9/2017 | Bhavnagarwala et al. |
| 9,786,370 B2 | 10/2017 | Aitken et al. |
| 9,792,982 B1 | 10/2017 | Sandhu |
| 9,792,984 B1 | 10/2017 | Bhavnagarwala et al. |
| 9,805,777 B2 | 10/2017 | Sandhu et al. |
| 9,851,738 B2 | 12/2017 | Sandhu et al. |
| 9,871,528 B1 | 1/2018 | Kumar et al. |
| 9,899,083 B1 | 2/2018 | Rosendale |
| 9,947,402 B1 | 4/2018 | Bhavnagarwala et al. |
| 9,972,388 B2 | 5/2018 | Das et al. |
| 9,978,942 B2 | 5/2018 | Shifren et al. |
| 9,979,385 B2 | 5/2018 | Sandhu et al. |
| 9,990,992 B2 | 6/2018 | Bhavnagarwala et al. |
| 9,997,424 B2 | 6/2018 | Arvin et al. |
| 9,997,702 B2 | 6/2018 | Reid et al. |
| 10,002,665 B1 | 6/2018 | Bhargava et al. |
| 10,002,669 B1 | 6/2018 | Bhargava et al. |
| 10,032,487 B2 | 7/2018 | Shifren et al. |
| 2008/0106925 A1* | 5/2008 | Paz de Araujo ........ H01L 45/04 365/148 |
| 2008/0106926 A1* | 5/2008 | Brubaker ............ H01L 27/2409 365/148 |
| 2008/0107801 A1 | 5/2008 | Celinska et al. |
| 2013/0285699 A1 | 10/2013 | McWilliams et al. |
| 2014/0061579 A1 | 3/2014 | Wei et al. |
| 2016/0163978 A1 | 6/2016 | Paz de Araujo et al. |
| 2017/0047116 A1 | 2/2017 | Sandhu et al. |
| 2017/0069378 A1 | 3/2017 | Shifren et al. |
| 2017/0092858 A1 | 3/2017 | Shifren |
| 2017/0147207 A1 | 5/2017 | Hansson et al. |
| 2017/0213960 A1 | 7/2017 | Paz de Araujo et al. |
| 2017/0237001 A1 | 8/2017 | Reid et al. |
| 2017/0244027 A1 | 8/2017 | Reid et al. |
| 2017/0244032 A1 | 8/2017 | Reid et al. |
| 2017/0288675 A1 | 10/2017 | Chandra et al. |
| 2017/0301859 A1 | 10/2017 | Paz de Araujo et al. |
| 2018/0013062 A1 | 1/2018 | Reid et al. |
| 2018/0019394 A1 | 1/2018 | Reid et al. |
| 2018/0053892 A1 | 2/2018 | Reid et al. |
| 2018/0095114 A1 | 4/2018 | Bhargave et al. |
| 2018/0096713 A1 | 4/2018 | Chandra et al. |
| 2018/0159028 A1 | 6/2018 | Shifren et al. |
| 2018/0159029 A1 | 6/2018 | Paz de Araujo et al. |
| 2018/0159031 A1 | 6/2018 | Paz de Araujo et al. |
| 2018/0175290 A1 | 6/2018 | Reid et al. |

OTHER PUBLICATIONS

Annex to Form PCT/ISA/206 Communication Relating to the Results of the Partial International Search, International Application No. PCT/GB2018/051822, dated Nov. 15, 2018, 3 pgs.

Provisional Opinion Accompanying the Partial Search Result, International Application No. PCT/GB2018/051822, dated Nov. 15, 2018, 8 pgs.

* cited by examiner

METHOD FOR THE MANUFACTURE OF A CORRELATED ELECTRON MATERIAL DEVICE

CROSS-REFERENCE TO RELATED APPLICATIONS

This application is related to U.S. patent application Ser. No. 15/641,124, titled "FABRICATING CORRELATED ELECTRON MATERIAL (CEM) DEVICES," filed Jul. 3, 2017, and incorporated herein by reference in its entirety.

The present disclosure is concerned with a method for the manufacture of a correlated electron material (CEM) device, which method comprises forming a thin film of a correlated electron material for the device having a predetermined electrical impedance when the CEM device in its relatively conductive (low impedance) state.

The present disclosure is also concerned with a CEM device comprising a thin film of a correlated electron material of predetermined electrical impedance when the device is in its relatively conductive (low impedance) state.

Electronic switching devices are found in a wide variety of electronic device types, such as computers, digital cameras, cellular telephones, tablet devices, personal digital assistants and so forth, where they may function as memory and/or logic devices.

Factors of interest to a designer in considering whether a particular electronic switching device is suitable for such a function, may include physical size, storage density, operating voltages, impedance ranges, and/or power consumption. Other factors of interest may include cost of manufacture, ease of manufacture, scalability and/or reliability.

There appears to be an ever-increasing drive towards memory and/or logic devices which can exhibit lower power and/or higher speed. Switching devices comprising a correlated electron material are at the forefront of this drive not just because they can exhibit low power and/or high speed but also because they are generally reliable and easily and cheaply manufactured.

The present disclosure describes an improved CEM device and methods for its manufacture. The CEM device may, in particular, be a switching device. The CEM switching device may find application as a correlated electron random access memory (CERAM) in memory and/or logic devices which may be used with a wide range of electronic circuit types, such as memory controllers, memory arrays, filter circuits, data converters, optical instruments, phase locked loop circuits, microwave and millimeter wave transceivers, and so forth.

A CEM switching device can exhibit a rapid conductor-to-insulator transition as compared to other switching devices because the switching is brought about by an electron correlation rather than by a solid state structural phase change or by formation of filaments, as is found respectively in phase change memory devices and resistive RAM devices.

The rapid conductor-to-insulator transition of a CEM switching device may, in particular, be responsive to a quantum mechanical phenomenon in contrast to the melting/solidification or filament formation found respectively in phase change and resistive RAM devices. The quantum mechanical transition in a CEM switching device between a relatively conductive state and a relatively insulative state (or between a first impedance state and a second impedance state) may occur in several ways.

In one respect, a quantum mechanical transition of a CEM between a relatively insulative/higher impedance state and a relatively conductive/lower impedance state may be understood in terms of a Mott transition.

As used herein, references to a Mott transition are references to traditional Mott transitions (which are described in the literature as purely coulombic) as well as references to Mott-like transitions (in which the coulombic interaction is modified by some other electron interaction, such as a dipole-core charge interaction). Accordingly, a reference to a Mott insulator includes a reference to a charge-transfer (Mott) insulator, such as nickel (II) oxide, in which the columbic interaction or screening is modified by a charge transfer complex through hybridisation with the oxygen band.

In accordance with a Mott transition, a material may switch from a relatively insulative/higher impedance state to a relatively conductive/lower impedance state if a Mott transition condition is satisfied. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state).

In another respect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

The switching from a relatively insulative/higher impedance state to a relatively conductive/lower impedance state may bring about a change in capacitance in addition to a change in resistance. For example, a CEM switch may exhibit a variable resistance together with a property of variable capacitance. In other words, impedance characteristics of a CEM switch may include both resistive and capacitive components. For example, in a metal state, a CEM switch may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a relatively conductive/lower impedance state in a CEM switch may result in changes in both resistance and capacitance.

A switching device formed from a CEM may exhibit switching of impedance states responsive to a Mott-transition in a majority of the volume of the CEM comprising the device. The CEM may, in particular, form a "bulk switch". As used herein, the term "bulk switch" refers to at least a majority volume of a CEM switching a device's impedance state, such as in response to a Mott-transition. For example, substantially all CEM of a device may switch from a relatively insulative/higher impedance state to a relatively conductive/lower impedance state or from a relatively conductive/lower impedance state to a relatively insulative/higher impedance state responsive to a Mott-transition.

In one arrangement, shown in FIG. 1, a CEM switching device may comprise a layer of correlated electron material (a CEM layer) sandwiched between a conductive substrate and a conductive overlay. In this arrangement, the CEM switching device can act as memory storage element. In other arrangements, the CEM switching device may comprise either a CEM layer provided on a conductive substrate or a CEM layer provided with a conductive overlay. In these other arrangements, the device comprises source and a drain regions providing for a flow of current across the device.

Referring now to FIG. 1A, a current density versus voltage profile 100 of a CEM switching device is shown which illustrates its switching behaviour. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may bring about a transition of the CEM switching device to a relatively low-impedance memory state. Conversely, application of a voltage $V_{reset}$ and a current density $J_{reset}$ may bring about a transition of the CEM device to a relatively high-impedance memory state.

As shown in FIG. 1A, reference designator 110 illustrates the voltage range that may separate $V_{set}$ from $V_{reset}$. Following placement of the CEM switching device into a high-impedance state or a low-impedance state, the particular state of the CEM switching device may be detected by application of a voltage $V_{read}$ (e.g., during a read operation) and detection of a current or current density at terminals of the CEM switching device (e.g., utilizing read window 107).

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM switching device may switch from a relatively low-impedance state to a relatively high-impedance state, for example, responsive to a Mott transition. This may correspond to point 108 of the voltage versus current density profile of FIG. 1A. At, or suitably nearby this point, electrons are no longer screened and become localized near the metal ion. This correlation may result in a strong electron-to-electron interaction potential which may operate to split the bands to form a relatively high-impedance material.

If the CEM switching device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain devices, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

The current in a CEM switching device may be controlled by an externally applied "compliance" condition, which may be determined at least partially on the basis of an applied external current, which may be limited during a write operation, for example, to place the CEM device into a relatively high-impedance state. This externally-applied compliance current may, in some devices, also set a condition of a current density for a subsequent reset operation to place the CEM device into a relatively high-impedance state. As shown in the particular device of FIG. 1A, a current density $J_{comp}$ applied during a write operation at point 116 to place the CEM switching device into a relatively low-impedance state, may determine a compliance condition for placing the CEM device into a high-impedance state in a subsequent write operation. As shown in FIG. 1A, the CEM device may be subsequently placed into a high-impedance state by application of a current density $J_{reset} \geq J_{comp}$ at a voltage $V_{reset}$ at point 108, at which $J_{comp}$ is externally applied.

The compliance may, in particular, set a number of electrons in a CEM switching device which may be "captured" by holes for the Mott transition. In other words, a current applied in a write operation to place a CEM device into a relatively low-impedance memory state may determine a number of holes to be injected to the CEM device for subsequently transitioning the CEM switching device to a relatively high-impedance memory state.

As pointed out above, a reset condition may occur in response to a Mott transition at point 108. Such a Mott transition may bring about a condition in the CEM switching device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \quad (1)$$

$$n = \left(\frac{C}{\lambda_{TF}}\right)^3$$

wherein $\lambda_{TF}$ corresponds to a Thomas Fermi screening length, and C is a constant.

A current or current density in region 104 of the voltage versus current density profile shown in FIG. 1A, may exist in response to injection of holes from a voltage signal applied across terminals of the CEM switching device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \quad (2)$$

$$Q(V_{MI}) = qn(V_{MI})$$

wherein $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$

$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}}\right)^3$$

wherein $A_{CEM}$ is a cross-sectional area of a CEM switching device; and $J_{reset}$ ($V_{MI}$) may represent a current density through the CEM switching device to be applied to the CEM switching device at a threshold voltage $V_{MI}$, which may place the CEM switching device into a relatively high-impedance state.

FIG. 1B shows a CEM switching device 150 comprising a CEM layer 160 sandwiched between a conductive substrate 170 and a conductive overlay 180 and a schematic diagram of an equivalent circuit for the switching device.

As previously mentioned, the CEM switching device may exhibit characteristics of both variable resistance and variable capacitance. In other words, the CEM switching device may be considered as a variable impedance device in which the impedance depends at least in part on resistance and capacitance characteristics of the device if measured across device terminals 190 and 190'. The equivalent circuit for a variable impedance device may comprise a variable resistor 192, such as variable resistor, in parallel with a variable capacitor 194. Of course, although a variable resistor and variable capacitor are depicted in FIG. 1B as comprising discrete components, the variable impedance device, such as that shown, may comprise a substantially homogenous CEM.

TABLE 1

Correlated Electron Switch Truth Table

| Resistance | Capacitance | Impedance |
|---|---|---|
| $R_{high}$ ($V_{applied}$) | $C_{high}$ ($V_{applied}$) | $Z_{high}$ ($V_{applied}$) |
| $R_{low}$ ($V_{applied}$) | $C_{low}$ ($V_{applied}$)~0 | $Z_{low}$ ($V_{applied}$) |

Table 1 illustrates an example truth table for an example variable impedance device, such as the device of FIG. 1A. Table 1 shows that a resistance of a variable impedance device, such as that shown, may transition between a low-impedance state and a substantially dissimilar, high-impedance state as a function at least partially dependent on a voltage applied across the CEM switching device. The impedance exhibited at a low-impedance state may, for example, be approximately in the range of 10.0-100,000.0 times lower than an impedance exhibited in a high-impedance state. However, the impedance exhibited at a low-impedance state may be approximately in the range of 5.0 to 10.0 times lower than an impedance exhibited in a high-impedance state. Table 1 also shows that a capacitance of a variable impedance device, such as the device shown, may transition between a lower capacitance state, which may, for example comprise an approximately zero, or very little, capacitance, and a higher capacitance state that is a function, at least in part, of a voltage applied across the CEM switching device.

The CEM switching device may be placed into a relatively low-impedance memory state, such as by transitioning from a relatively high impedance state, for example, via injection of a sufficient quantity of electrons to satisfy a Mott transition criteria. In transitioning a CEM switching device to a relatively low-impedance state, if enough electrons are injected and the potential across the terminals of the CEM device overcomes a threshold switching potential (e.g., $V_{set}$), injected electrons may begin to screen. As previously mentioned, screening may operate to delocalize double-occupied electrons to collapse the band-splitting potential, thereby bringing about a relatively low-impedance state.

It has now been surprisingly found that the electrical (hole) conductivity of a thin film of a transition metal compound, such as a transition metal oxide, which is doped by a back-donating ligand, may be directly proportional to the concentration of the back-donating ligand in the transition metal compound.

Without wishing to be bound by theory, it is surmised that the back donation between the transition metal and dopant ligand in the correlated electron material predominantly controls the lowering the Fermi energy (and energy gap) between normally equivalent "d"- or "f"-orbitals on the metal and for providing the necessary p-type degeneracy for hole conduction of the correlated electron material in its relatively conductive (low impedance) state.

The electrical impedance of a thin film of a correlated electron material may, therefore, be carefully controlled (and finely tuned) in a physical or chemical vapour deposition process, such as an atomic layer deposition, by precisely controlling the incorporation of a dopant comprising a back-donating ligand through the deposition process parameters.

Accordingly, the present disclosure provides a method for the manufacture of a CEM device comprising forming a thin film of a correlated electron material having a predetermined electrical impedance when the CEM device in its relatively conductive (low impedance) state, wherein the forming of the CEM thin film comprises forming a d- or f-block metal or metal compound doped by a physical or chemical vapour deposition with a predetermined amount of a dopant comprising a back-donating ligand for the metal.

References herein to a "back-donating" ligand are references to a ligand exhibiting metal-ligand bonding wherein the ligand supplies (donates) one or more electrons (i.e. electron density) to a metal (i.e. metal atom or ion) and at the same time the metal (i.e. atom or ion) supplies (back-donates) electron density from an occupied d- or f-orbital to an unoccupied $\pi^*$-orbital or a $\sigma^*$-orbital having a n-symmetry on the ligand.

In embodiments, the method may form the CEM thin film with a predetermined amount of one or more of a dopant comprising a back-donating ligand.

Suitable back-donating ligands include carbonyl (CO), nitrosyl (NO), an isocyanide (RNC, where R is H, $C_1$-$C_6$ alkyl or $C_6$-$C_{10}$ aryl), dioxygen ($O_2$), dihydrogen ($H_2$), an alkene (for example, ethene), an alkyne (for example, ethyne) or phosphinyl ($R_3P$ where R is $C_1$-$C_6$ alkyl or $C_6$-$C_{10}$ aryl).

In embodiments, the method may form a CEM thin film comprising one or more of a d-block or f-block metal or metal compound. It may, for example, form a CEM thin film comprising one or more of a transition metal, lanthanide or actinide or a transition metal oxide, for example, one or more of nickel oxide, cobalt oxide, iron oxide, or one or more a rare earth oxide, such as yttrium oxide or indium oxide.

In embodiments, the method may form a CEM thin film of general form AB:$L_x$ (for example, NiO:CO) wherein the AB denotes, for example, a transition metal compound, such as a transition metal oxide, $L_x$ denotes an extrinsic back-donating ligand for the metal and x indicates the number of units of ligand for one unit of the transition metal or transition metal compound. The value of x for any specific ligand and any specific combination of ligand with a transition metal oxide may be determined simply by balancing valences.

In embodiments, the method may form a CEM thin film of a transition metal oxide, such as NiO:$L_x$ wherein the dopant comprising a back-donating ligand comprises a molecule of the form $C_aH_bN_dO_f$ (in which a≥1, and b, d and f≥0) such as: carbonyl (CO), cyano (CN$^-$), ethylenediamine ($C_2H_8N_2$), 1,10-phenanthroline ($C_{12}H_8N_2$), bipyridine ($C_{10}H_8N_2$), pyridine ($C_5H_5N$), acetonitrile ($CH_3CN$) and cyanosulfanides such as thiocyanate (NCS$^-$).

In one embodiment, the forming of the CEM thin film layer comprises a physical vapour deposition, such as reactive sputtering, of a transition metal compound, for example, a transition metal oxide, in an atmosphere of a gaseous oxide, such as carbon monoxide (CO).

In other embodiments, the forming of the CEM thin film layer comprises a chemical vapour deposition, such as an atomic layer deposition (ALD), of a transition metal compound, for example, a transition metal oxide.

The atomic layer deposition may form the CEM thin film utilising separate precursor molecules AX and BY, according to the expression (4) below:

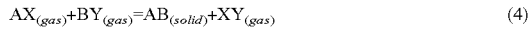

$$AX_{(gas)} + BY_{(gas)} = AB_{(solid)} + XY_{(gas)} \quad (4)$$

wherein "A" of expression (4) corresponds to the transition metal, and "AB" a transition metal compound, such as a transition metal oxide.

In these embodiments, "X" of expression (4) may comprise one or more of a ligand, such as an organic ligand, for example, amidinate (AMD), cyclopentadienyl (Cp), di(ethylcyclopentadienyl) ((EtCp)$_2$), bis(2,2,6,6-tetramethylheptane-3,5-dionato) ((thd)$_2$), acetylacetonate (acac), bis(methylcyclopentadienyl) ((MeCp)$_2$), dimethylglyoximate (dmg)$_2$, (apo)$_2$ where apo=2-amino-pent-2-ene-4-onato, (dmamb)$_2$ where dmamb=1-dimethylamino-2-methyl-2-butanolate, (dmamp)$_2$ where dmamp=1-dimethylamino-2-methyl-2-propanolate and bis(pentamethylcyclopentadienyl) ($C_5(CH_3)_5$)$_2$.

Suitable precursor molecules AX include, therefore, organometallic compounds of the transition metals (especially the late transition metals) having one or more of these ligands alone or in combination together with other ligands.

Accordingly, in some embodiments, a nickel based precursor AX (NiX) may comprise, for example, nickel amidinate (Ni(AMD)), bis(cyclopentadienyl)nickel (Ni(Cp)$_2$), nickel acetoacetonate (Ni(acac)$_2$), nickel dimethylglyoximate (Ni(dmg)$_2$), bis(ethylcyclo-pentadienyl)nickel (Ni(EtCp)$_2$), bis(methylcyclopentadienyl)nickel (Ni(CH$_3$C$_5$H$_4$)$_2$), nickel 2-amino-pent-2-en-4-anate (Ni(apo)$_2$), Ni(dmamb)$_2$ where dmamb=1-dimethylamino-2-methyl-2-butanolate, Ni(dmamp)$_2$ where dmamp=1-dimethylamino-2-methyl-2-propanolate or bis(pentamethyl-cyclopentadienyl) nickel (Ni(C$_5$(CH$_3$)$_5$)$_2$).

The precursor "BY" in expression (4) may comprise a gaseous oxide (as an oxidant), such as water (H$_2$O), oxygen (O$_2$), ozone (O$_3$), nitric oxide (NO), nitrous oxide (N$_2$O) hydrogen peroxide (H$_2$O$_2$) or plasma-formed oxygen radical (O$^-$).

In one embodiment, the method comprises forming the CEM thin film by an atomic layer deposition of one or more of a transition metal (especially a late transition metal) carbonyl and an oxidant.

Suitable transition metal carbonyls include, for example, nickel tetracarbonyl (Ni(CO)$_4$), carbonyl pentacarbonyl (Fe(CO)$_5$), dicobalt octacarbonyl (Co$_2$(CO)$_8$), triruthenium dodecacarbonyl (RU$_3$(CO)$_{12}$), tetrarhodium dodecacarbonyl (Rh$_4$(CO)$_{12}$), triosmium dodecacarbonyl (Os$_3$CO$_{12}$), tetrairidium dodecacarbonyl (Ir$_4$(CO)$_{12}$).

In embodiments, the atomic layer deposition may employ an organometallic precursor comprising a back-donating or other ligand and a gaseous oxidant, such as oxygen, wherein the partial pressure of the oxidant is controlled (by for example, a mass flow controller) so that the thin film is first formed with an excess of metal ion.

In this embodiment, the partial pressure of the oxidant may generally be less than that necessary for formation of stoichiometric transition metal oxide (which is not doped), and may also be less than that necessary for the complete oxidation of interstitial metal ion.

Note that the predetermined electrical impedance of the CEM thin film will be inversely proportional to the concentration of the back-donating ligand in the metal compound.

Note also that the electrical conductivity (or conductance) of the CEM thin film will be predetermined and directly proportional to the concentration of back-donating ligand in the metal compound.

Of course, the control of the predetermined amount of back-donating ligand may also depend on the number of back-donating ligands in the transition metal precursor AX as well as the deposition process conditions.

The predetermined amount of dopant comprising a back-donating ligand may vary between amounts providing for an atomic concentration of back donating ligand between 0.1% and 15.0%, for example, between 0.1% and 10.0%. As referred to herein the term atomic concentration relates to the concentration of atoms in the finished material that derive from the substitutional ligand. For example, in the case that the substitutional ligand is carbonyl, the atomic concentration of carbonyl in percentage terms is the total number of carbon and oxygen atoms that are in carbonyl motifs in the finished material divided by the total number of atoms in the finished material multiplied by 100.

The predetermined electrical impedance of the CEM thin film can be determined or selected in advance of forming the CEM thin film for a device. The selection may, for example, be made by experiment or by consultation with a library correlating the electrical conductivity (with dopant concentration) of CEM thin films of a transition metal compound, such as a transition metal oxide, with suitable precursors and atomic layer deposition process conditions.

In embodiments, the method may form a CEM thin film having a predetermined electrical impedance which is selected to match the conductivity of the device to the (mutual) transductance ($g_m$) of one or more in-series field effect transistors (FETS).

In one embodiment, therefore, the method may form a CEM thin film having a (predetermined) electrical conductivity between $10^3$ S/m and $10^{10}$ S/m.

In these and other embodiments, the method may form a CEM thin film having a thickness from 1 nm to 10 nm, for example, 3 nm or 5 nm.

Further, the method may form a CEM thin film of width above 3 nm, for example 5 nm or 10 nm or more. The method may form a CEM thin film of cross-sectional area above 25 nm$^2$, for example, 500 nm$^2$ or more. In one embodiment, the method may form a thin film having minimum cross-sectional area 25 nm$^2$ with electrical conductivity approaching $10^5$ S/m or more.

In embodiments, the method may form a thin film of correlated electron material comprising a transition metal oxide having a dopant or dopants comprising different back-donating metal ligands. The different back-donating metal ligands may facilitate fine tuning of the electrical impedance of the CEM thin film.

The atomic layer deposition may provide that the thin film is "born-on" viz., the device is in its conductive state when it is first formed. It may also provide that the thin film comprises a transition metal in several oxidation states without a substantial presence of free metal.

In certain embodiments, the method may further comprise annealing the deposited thin film in an atmosphere comprising an oxidant (such as oxygen ($O_2$) or carbon monoxide (CO)) at a partial pressure and temperature maintaining the ratio of concentration of back-donating metal ligand, such as carbonyl ligand, to concentration of the stoichiometric transition metal compound, such as transition metal oxide.

It has also been found that the magnitude of the (hole) leakage current of a CEM device in its relatively insulative (high impedance) state may be directly proportional to the extent of doping by a back-donating metal ligand.

In that case, the electrical performance of a CEM device may be better the smaller the cross-sectional area of the film.

Accordingly, the method may also comprise forming the CEM thin film with a predetermined cross-sectional area and a predetermined electrical impedance selected to provide a predetermined (hole) leakage current density for a device in its relatively insulative (high impedance) state.

The method may provide for CEM devices having dimensions which are (10% to 50%) smaller as compared to those of the CEM devices presently in the art.

A CEM device comprising a thin film of a correlated electron material having a predetermined electrical impedance when the CEM device is in its conductive state wherein the thin film comprises a d- or f-block metal or metal compound doped with a predetermined amount of a back-donating ligand for the metal.

In embodiments, the CEM thin film may comprise one or more of a d-block or f-block metal or compounds of a d-block or f-block metal. It may, for example, comprise one or more of a transition metal oxide, for example, nickel oxide, cobalt oxide, iron oxide and/or one or more a rare earth oxide, such as yttrium oxide or indium oxide.

In one embodiment, the CEM thin film comprises a transition metal (especially a late transition metal) compound, such as a transition metal oxide, which is doped with a predetermined amount of a dopant comprising a carbonyl ligand.

As mentioned above, suitable back-donating ligands comprise not only carbonyl (CO) but also nitrosyl (NO), an isocyanide (RNC where R is H, $C_1$-$C_6$ alkyl or $C_6$-$C_{10}$ aryl), dioxygen ($O_2$), dihydrogen ($H_2$), an alkene (for example, ethene), an alkyne (for example, ethyne) and phosphinyl ($R_3$P where R is $C_1$-$C_6$ alkyl or $C_6$-$C_{10}$ aryl).

Other suitable back-donating ligands may comprise fluoride (F), chloride (Cl), bromide (Br), sulfur (S), carbon (C) or be selected from molecules of formula $C_aH_bN_dO_f$ (in which a≥1, and b, d and f≥0) such as: carbonyl (CO), cyano ($CN^-$), ethylenediamine ($C_2H_8N_2$), 1,10-phenanthroline ($C_{12}H_8N_2$), bipyridine ($C_{10}H_8N_2$), pyridine ($C_5H_5N$), acetonitrile ($CH_3CN$) and cyanosulfanides such as thiocyanate ($NCS^-$).

As mentioned above, the electrical impedance of the CEM thin film can be determined or selected in advance of manufacturing the device. The determination or selection may, for example, be made by experiment or by reference to a library correlating the electrical conductivity (and dopant concentration) of CEM thin films of a transition metal compound, such as a transition metal oxide, with suitable precursors and atomic layer deposition process conditions.

The predetermined amount of dopant comprising back-donating metal ligand may vary between amounts providing an atomic concentration of ligand between 0.1% and 15.0%, for example, between 0.1% and 10.0%.

In embodiments, the electrical conductivity of the CEM thin film has a value between $10^3$ S/m and $10^{10}$ S/m.

In one embodiment, the predetermined electrical impedance of the CEM thin film has a value which is selected to match the conductivity (or conductance) of the device with the (mutual) transductance ($g_m$) of one or more in-series field effect transistors (FETS) within a selected circuit.

In these and other embodiments, the CEM thin film may have a thickness from 1 nm to 10 nm, for example, 3 nm. The CEM thin film may have a (square or rectangular) width between 3 nm and 25 nm, for example 5 nm. The CEM thin film may have a cross-sectional area as low as 25 $nm^2$ although any cross-sectional area found in the art is possible. In one embodiment, the thin film has cross-sectional area 25 $nm^2$ and an electrical conductivity approaching or above $10^5$ S/m or $10^7$ S/m or $10^8$ S/m.

In some embodiments, the transition metal compound comprises a transition metal oxide (TMO:dopant) such as nickel oxide (NiO), an iron oxide (for example, FeO), a cobalt oxide (for example, CoO), a ruthenium oxide (for example, $RuO_2$), rhodium oxide (for example, $Rh_2O_3$), osmium tetroxide ($OsO_4$), iridium oxide ($IrO_2$), and mixtures thereof.

In a preferred embodiment, however, the transition metal compound comprises nickel oxide (NiO:dopant) which is doped with a predetermined amount of carbonyl ligand.

As mentioned above, the magnitude of the (hole) leakage current of a CEM device (in its insulative state) may be directly proportional to the extent of doping by a back-donating metal ligand.

In that case, the performance of the CEM device may be improved by providing that area of the CEM thin film (and device) is smaller.

In certain embodiments, the device may have a (hole) leakage current (the ubiquitous parasitic MIM diode current) density in its relatively insulative (high impedance) state of less than or equal to 500 A/$cm^2$, for example, 250 A/$cm^2$ or 100 A/$cm^2$ or 50 A/$cm^2$.

A method for tuning the electrical conductivity (or impedance) of a CEM device in its relatively conductive (low impedance) state to the transductance of one or more in-series field effect transistors in an electrical circuit, which method comprises forming a first thin film of a correlated electron material by a physical or chemical vapour deposition of a d- or f-block metal or metal compound which is doped by a first amount of back-donating ligand for the metal; comparing the electrical conductivity of the first thin film in its relatively conductive state to the transductance of the one or more in-series field effect transistors; and repeating these steps by forming one or more other thin films of a correlated electron material each having a different amount of back-donating ligand for the metal as compared to the first thin film layer until the electrical conductivity of one of the other thin films in its relatively conductive state matches the conductivity of the device to the transductance of the one or more in-series field effect transistors.

Of course, the first and the one or more other (additional) thin films of correlated electron material are formed independently of each other by, for example, an atomic layer deposition.

In these and other embodiments, the method may comprise forming a plurality of CEM devices wherein a first CEM device is associated with the first thin film and one or more other CEM devices are correspondingly associated with the one or more other CEM thin films. The first CEM device and the one or more other CEM devices may be identical save in the first and one or more other CEM thin films.

The method may, therefore, provide for direct tuning of a CEM device within an electrical circuit.

Of course, the first and different amounts of back-donating metal ligand in the first and additional CEM thin films may be brought about by control of the process conditions, such as temperature, flow rate (partial pressure) of oxidant for the atomic layer deposition, as well as by use of different oxidants for differently doped additional thin films.

The predetermined amount of back-donating metal ligand in each CEM thin film may vary between amounts providing an atomic concentration of carbon, oxygen, hydrogen or nitrogen between 0.1% and 15.0%, for example, between 0.1% and 10.0%.

In a fourth aspect, the present disclosure provides a library comprising a database for storing and retrieving data relating the electrical impedance (or conductivity) of a CEM thin film comprising a d- or f-block metal or metal compound doped with a dopant comprising a back-donating ligand for the metal to standard apparatus, standard reactants and process parameters for obtaining the CEM layer by chemical vapour deposition such as an atomic layer deposition.

The methods and device according to the present disclosure will now be described in more detail having regard to the following embodiments and the accompanying drawings in which.

Figure 1A:
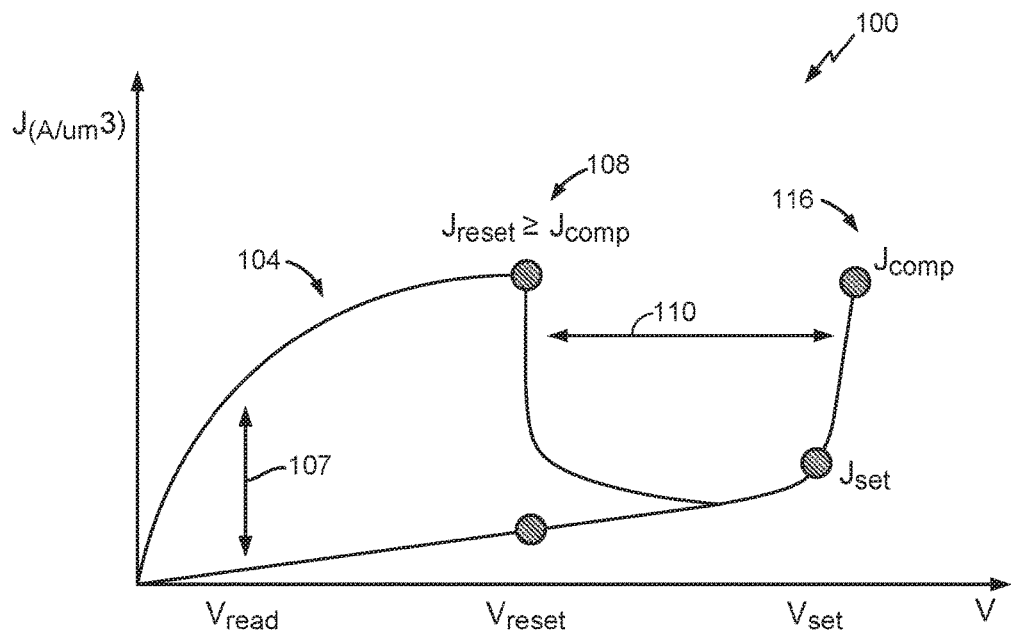
FIG. 1A shows a schematic illustration of a current density versus voltage profile of a CEM switching device.
Figure 1B:
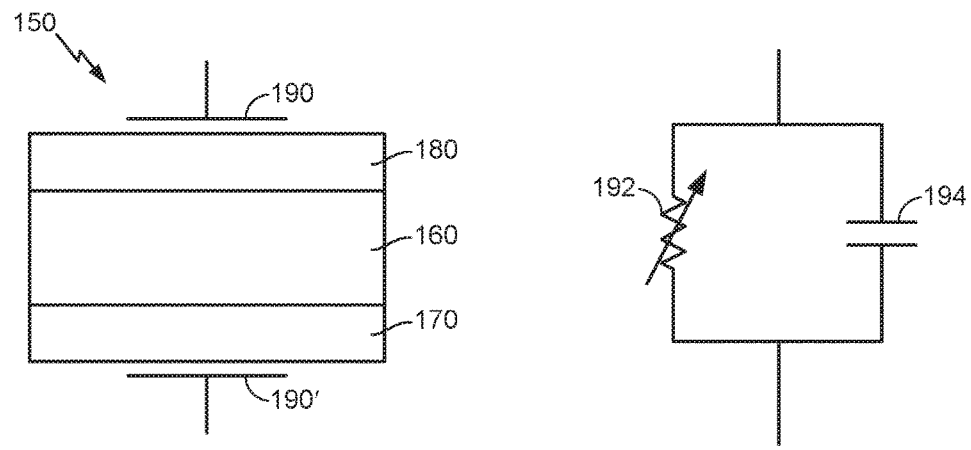
FIG. 1B shows a schematic illustration of the CEM switching device of FIG. 1A and a schematic diagram of an equivalent circuit for the switching device.
Figure 2:
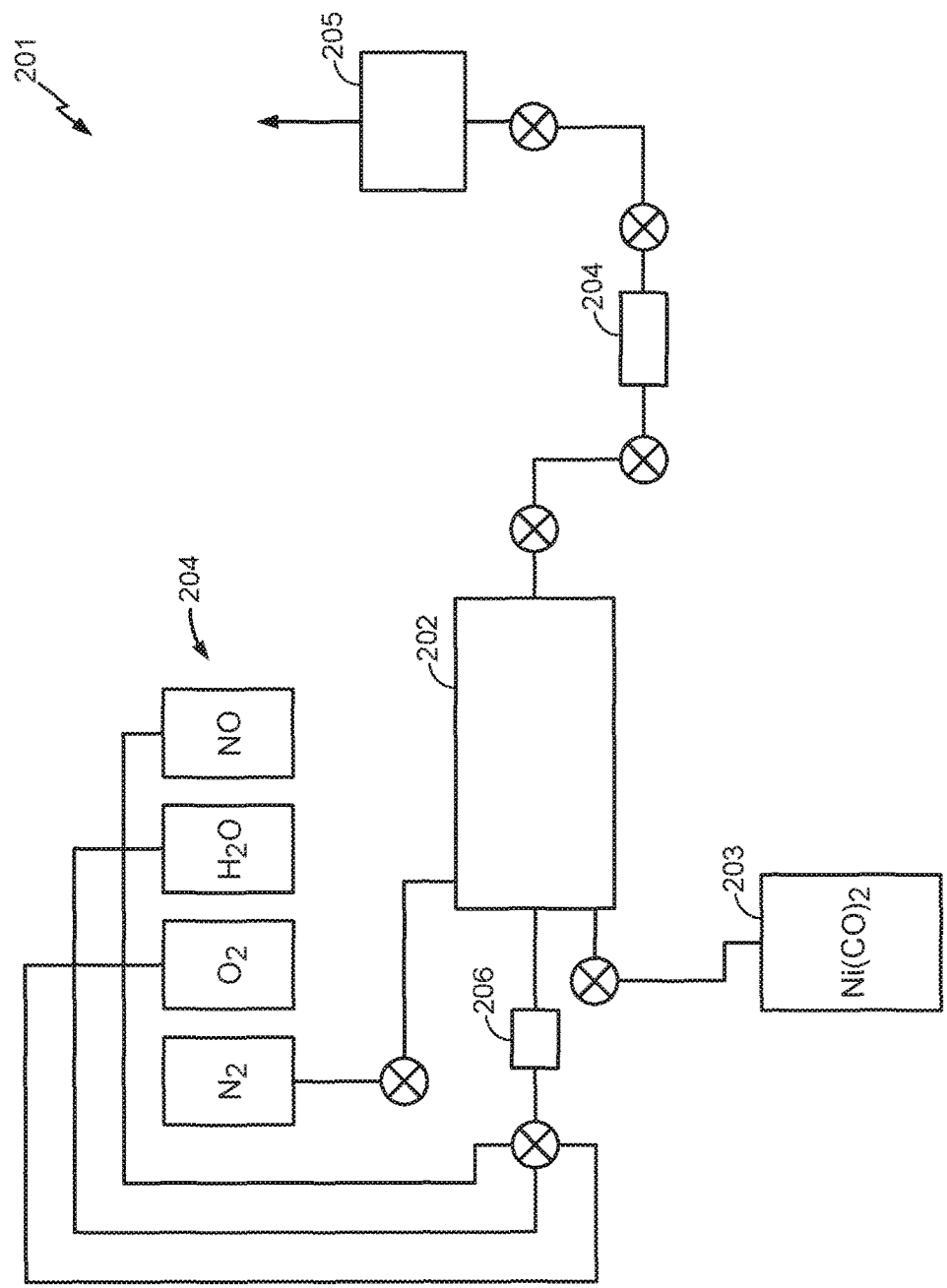
FIG. 2 is a schematic illustration of apparatus for implementing methods for forming the storage element.

Referring now to the accompanying drawings FIG. 2 shows an apparatus 201 for forming a thin film by atomic layer deposition (or chemical vapour deposition). The apparatus comprises a process chamber 202 connected to up line sources of a metal-containing reactant precursor 203 such as tetracarbonyl nickel $Ni(CO)_4$, a purge gas $N_2$ and several reactant precursors 204 comprising oxidants of differing reactivity for the metal-containing reactant precursor, $O_2$, $H_2O$ and NO. The reactivity of these reactant precursors has the order $O_2 > H_2O > NO$.

The process chamber 202 includes a platform (not shown) providing for the placement of a semiconductor substrate in the middle of the process chamber 202 and equipment (not shown) regulating the pressure, temperature and gas flow within the chamber in combination with a vacuum pump 204 connected to downline of the process chamber 202. The vacuum pump 204 evacuates to an abatement chamber 205 where the reactant precursors and by-products of reaction are made safe before they enter the environment.

The apparatus includes a plurality of independently operable valves which help regulate the gas flow up line and downline of the process chamber. The up-line valves allow the reactant precursors and purge gas to enter the process chamber 202 sequentially and enable a selection of one or other oxidant or a particular combination of oxidants for reaction with tetracarbonyl nickel $Ni(CO)_4$ and/or the surface of the substrate.

The equipment regulating the gas flow in the pressure chamber includes a mass flow controller 206 providing very precise and highly repeatable control of the amount of oxidant introduced into the process chamber in a predetermined time period.

The apparatus is first prepared for use by loading the platform with the semiconductor wafer and evacuating the chamber 202 by operating the vacuum pump 204 and opening the up-line valves for the purge gas $N_2$. During the purging, the process chamber 202 is heated to the temperature which has been selected for the thin film forming process.

Figure 3:
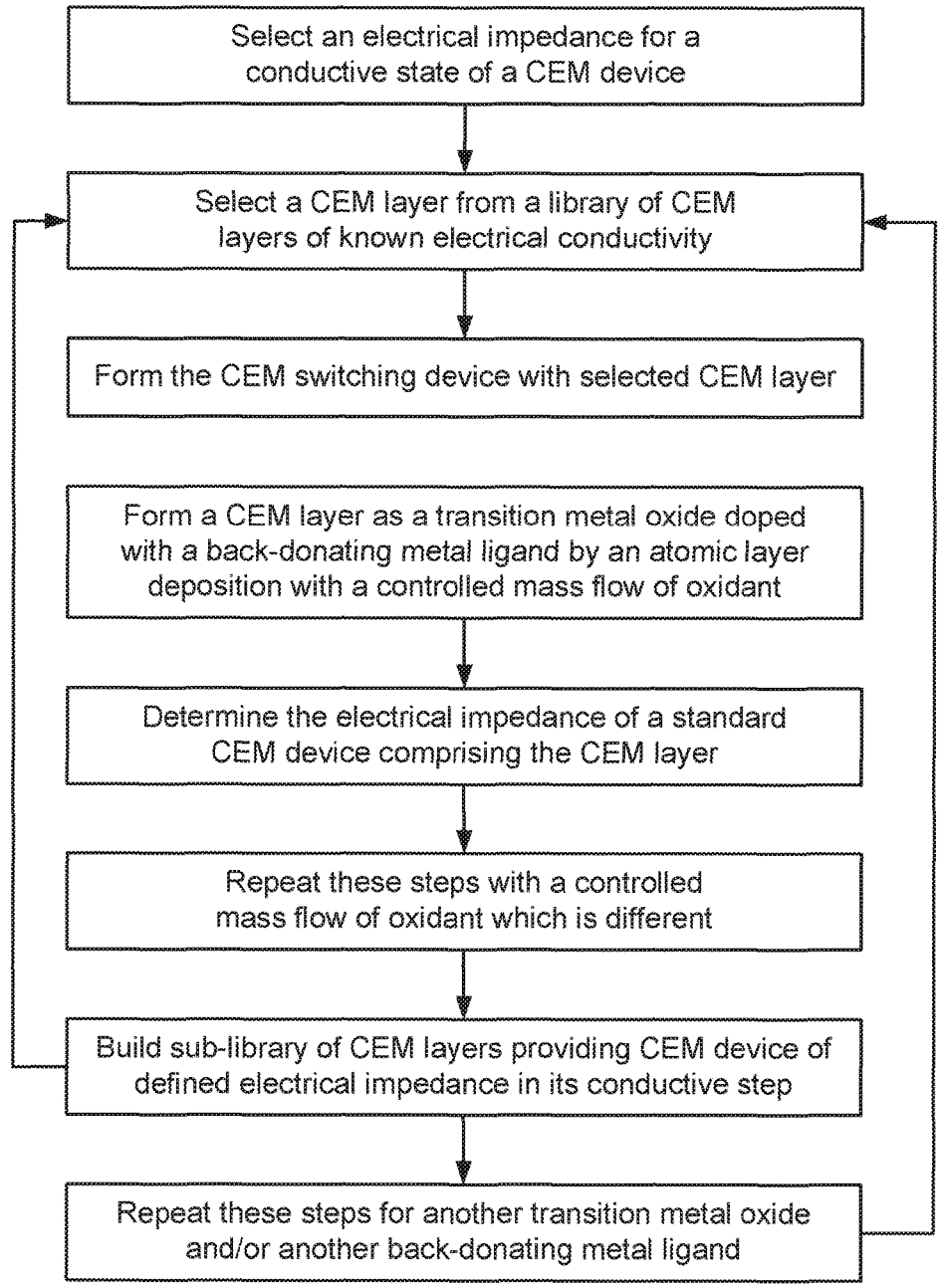
FIG. 3 is a flow diagram showing a scheme for forming a CEM switching device of FIG. 1 having a predetermined electrical impedance in its conductive state.

Referring now to FIG. 3, the use of a CEM device having desired electrical impedance in its conductive state relies upon selection of a CEM layer for the CEM device which has a predetermined electrical conductivity when the device is in its conductive state.

The selection of the CEM layer may be made from a library of CEM layers of known electrical conductivity in a standard CEM switching device (similar to that described above). The library may contain sub-libraries comprising a plurality of CEM transition metal oxide layers in which each CEM layer comprises the same transition metal oxide but is doped to an extent which is different as compared to any other CEM layer. Of course, the library may also contain sub-libraries which refer to different transition metal oxides and the same or different back-donating metal ligands.

The library may, for example, refer to a sub-library of CEM layers comprising nickel oxide wherein each CEM layer is doped by a carbonyl ligand to an extent which different as compared to any other CEM layer.

The library may relate the electrical conductivity of a CEM layer to apparatus, reactants and parameters for obtaining the CEM layer by an atomic layer deposition. It may, for example, specify apparatus according to FIG. 2 as well as reactants and parameters for use with the apparatus.

The library may specify reactants and operating parameters for apparatus that provide essentially for control of the extent of doping of the CEM layer by control of the partial pressure (or mass flow) of the oxidant during a predetermined time period.

The library may, for example, indicate apparatus according to FIG. 2, tetracarbonyl nickel $Ni(CO)_4$ as the metal-containing reactant precursor 203, $O_2$ as the oxidant, process chamber temperature, exposure times as well as partial pressure (or mass flow) of oxidant.

In that case, the forming of a CEM switching device having a predetermined electrical impedance in its conductive state may comprise forming a CEM layer of a thin film of nickel oxide which is doped to a predetermined extent on the semiconductor wafer by atomic vapour deposition employing cycles of the following operations.

First, the up-line valves for the purge gas are closed and the up-line valves for the are opened. After a predetermined time period in which the semiconductor wafer is exposed to and reacts with tetracarbonyl nickel $Ni(CO)_4$, the up-line valves for tetracarbonyl nickel $Ni(CO)_4$ are closed and the up-line valves for the purge gas are reopened.

After a predetermined time period, the up-line valves for the purge gas are closed and the up-line valves for O₂ are opened. After a predetermined time period in which the semiconductor wafer is exposed to and reacts with O₂ at the specified partial pressure and temperature, the up-line valves for O₂ are closed and the up-line valves for the purge gas are reopened.

The number of cycles of these operations is selected to provide a thin film layer on the semiconductor wafer of a desired thickness on the semiconductor wafer.

The time period during which the semiconductor wafer or thin film layer is exposed to O₂ is selected so that the oxygen gas flow during that period is insufficient for complete reaction of the reactive sites on the semiconductor wafer or thin film layer with oxygen.

The gas flows during this time period can be easily adjusted by the mass flow controller so that they are different. The adjustment enables a fine tuning in the amount of dopant in the thin film layer.

The final nickel oxide thin film is obtained by an annealing carried out in the process chamber 202 during a predetermined time period in which purging with nitrogen is maintained. The temperature of the process chamber 202 and/or the pressure therein may be maintained or adjusted to a selected value or values during this predetermined time period.

Figure 4:
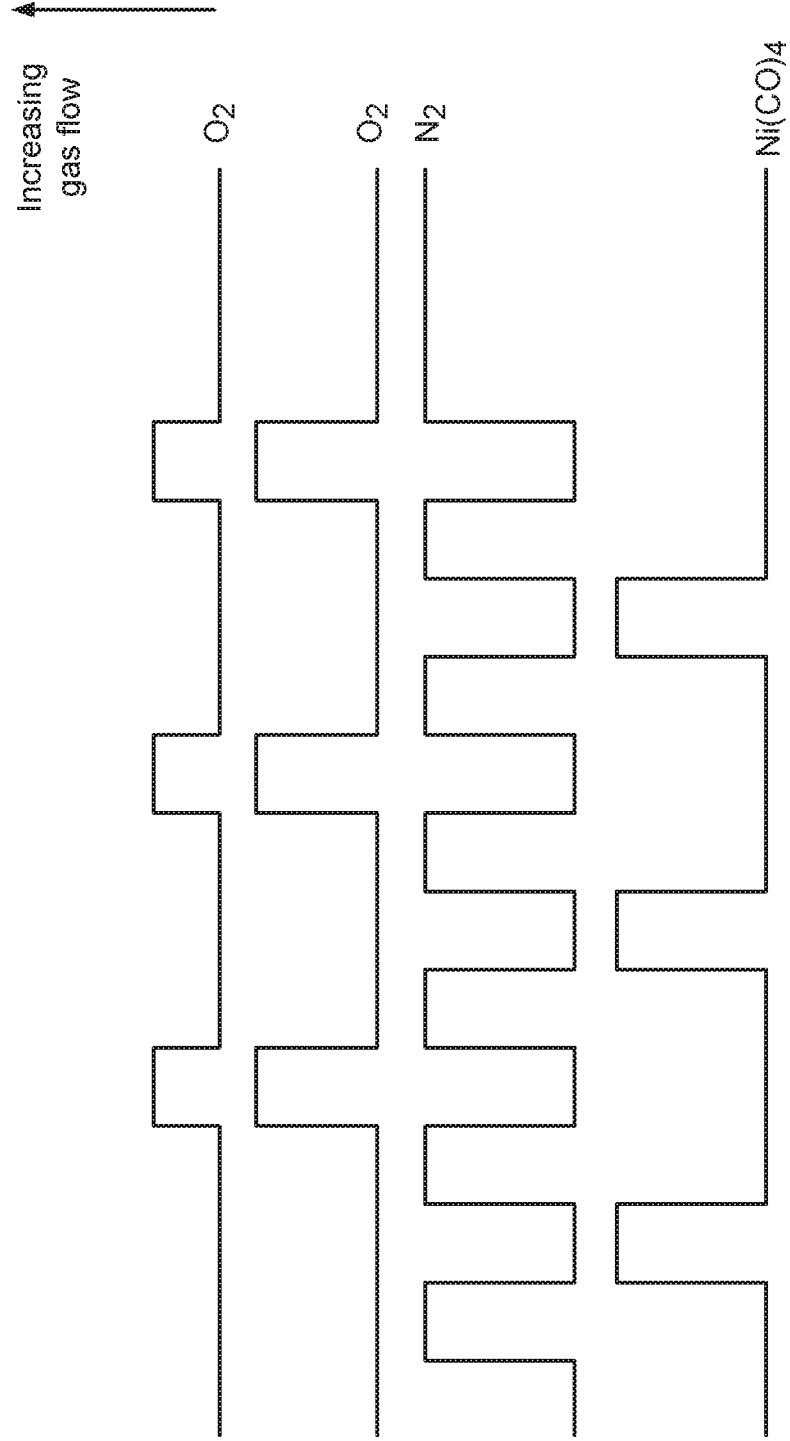
FIG. 4 shows pulse profiles for atomic layer deposition which may be used for forming CEM switching devices having different predetermined electrical impedance in their conductive states.

FIG. 4 shows the gas flows in the apparatus during the formation of two CEM layers having a differing extent of doping by an atomic vapour deposition as described above.

The gas flows exhibit pulse profiles showing the relative amounts of metal-containing reactant precursor, oxidants and purge gas during the predetermined periods for formation of the CEM layers.

As may be seen, the relative amount of oxidant for the atomic layer deposition of the CEM layer with a higher extent of doping by carbonyl is greater than the relative amount of oxidant for the atomic layer deposition of the CEM layer with a higher extent of doping by carbonyl. The predetermined time period of exposure to the semiconductor wafer is the same for each of the reactant precursors and the two oxidants.

Figure 5:
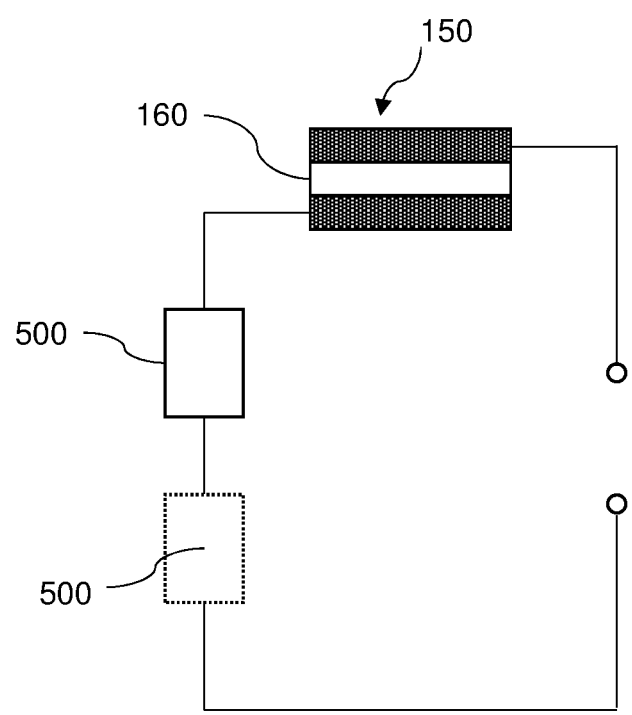
FIG. 5 is a schematic illustration showing a CEM device arranged in series with one or more field effect transistors (FETs).

Referring now to FIG. 5, there is shown a CEM device 150 which is arranged in series with one or more field effect transistors (FETs) in a selected electronic circuit. The predetermined electrical impedance of the CEM thin film 160 when the CEM device 150 is in its conductive state is selected to match the conductivity of the CEM device 150 to the transductance of the one or more in series field effect transistors 500 (shown in solid and dotted outline).

The invention claimed is:

1. A method for the manufacture of a correlated electron material (CEM) device comprising forming a CEM thin film of a correlated electron material having a predetermined electrical impedance when the CEM device is in its relatively conductive (low impedance) state, wherein the forming of the CEM thin film comprises forming a d- or f-block metal or metal compound by a physical or chemical vapour deposition with a predetermined amount of a dopant comprising a back-donating ligand for the metal to impart the predetermined electrical impedance, and wherein the predetermined electrical impedance is selected to match a conductivity of the CEM device with a transductance of one or more in-series field effect transistors.

2. The method according to claim 1, comprising forming the CEM thin film by a chemical vapour deposition, such as an atomic layer deposition.

3. The method according to claim 1, comprising forming the CEM thin film to have an electrical conductivity between $10^3$ S/m and $10^{10}$ S/m.

4. The method according to claim 1, comprising forming the CEM thin film to have a cross-sectional area between 25 nm² and 500 nm².

5. The method according to claim 1, wherein the back-donating ligand for the metal is selected from the group of back-donating ligands consisting of carbonyl, nitrosyl, isocyanide, dioxygen, dihydrogen, alkene, alkyne or phosphinyl.

6. The method according to claim 1, wherein the back-donating ligand for the metal comprises one or more molecules of formula $C_aH_bN_dO_f$ (in which a≥1, and b, d and f≥0) such as: carbonyl (CO), cyano (CN⁻), ethylenediamine ($C_2H_8N_2$), 1,10-phenanthroline ($C_{12}H_8N_2$), bipyridine ($C_{10}H_8N_2$), pyridine ($C_5H_5N$), acetonitrile ($CH_3CN$) and cyanosulfanides such as thiocyanate (NCS⁻).

7. The method according to claim 1, wherein the d-block metal or metal compound comprises nickel, iron, cobalt, ruthenium, rhodium, osmium or iridium.

8. The method according to claim 1, wherein the forming of the CEM thin film comprises forming nickel oxide with a predetermined amount of a dopant comprising a back-donating ligand for nickel.

9. A correlated electron material (CEM) device comprising a CEM thin film of a correlated electron material having a predetermined electrical impedance when the CEM device is in its conductive state wherein the CEM thin film comprises a d- or f-block metal or metal compound doped with a predetermined amount of a back-donating ligand for the metal to impart the predetermined electrical impedance, and wherein the CEM thin film has a predetermined electrical impedance selected to match a conductivity of the CEM device to a transductance of one or more in-series field effect transistors.

10. The device according to claim 9, wherein the CEM thin film has an electrical conductivity between $10^3$ S/m and $10^{10}$ S/m.

11. The device according to claim 9, wherein the CEM thin film has a cross-sectional area between 25 nm² and 500 nm².

12. The device according to claim 9, wherein the CEM thin film comprises a transition metal oxide selected from the group consisting of oxides of nickel, iron, cobalt, ruthenium, osmium, iridium and mixtures thereof.

13. The device according to claim 9, having a leakage current density (viz., a parasitic MIM diode current density) in its insulative state less than or equal to 500 A/cm².

14. A method for tuning an electrical conductivity (or impedance) of a correlated electron material (CEM) device in its relatively conductive (low impedance) state to a transductance of one or more in-series field effect transistors in an electrical circuit, which method comprises steps of forming a first thin film of correlated electron material by a physical or chemical vapour deposition of a d- or f-block metal or metal compound which is doped by a first amount of back-donating ligand for the metal; comparing the electrical conductivity of the first thin film in its relatively conductive state to the transductance of the one or more in-series field effect transistors; and repeating these steps by forming one or more other thin films of correlated electron material each having a different amount of back-donating ligand for the metal as compared to the first thin film layer until the electrical conductivity of one of the other thin films in its relatively conductive state matches the conductivity of the device to the transductance of the one or more in-series field effect transistors.

15. The method according to claim 14, wherein the forming of the first and the one or more other thin films of correlated electron material comprises atomic layer deposition.

* * * * *